US006457156B1

(12) United States Patent
Stenfort (10) Patent No.: US 6,457,156 B1
(45) Date of Patent: Sep. 24, 2002

(54) ERROR CORRECTION METHOD

(75) Inventor: Ross J. Stenfort, Los Altos, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/015,727

(22) Filed: Jan. 29, 1998

(51) Int. Cl.$^7$ .............................................. H03M 13/00
(52) U.S. Cl. ...................... 714/785; 714/52; 714/752; 714/755; 714/756; 714/762; 714/763; 714/769; 714/774; 714/784; 714/793; 369/32; 369/58; 369/116
(58) Field of Search .................. 714/785, 793, 714/774, 52, 755, 756, 784, 752, 769, 762, 763; 375/347; 369/116, 32, 58

(56) References Cited

U.S. PATENT DOCUMENTS

| | | | | |
|---|---|---|---|---|
| 4,334,309 A | * | 6/1982 | Bannon et al. | 714/766 |
| 4,564,945 A | * | 1/1986 | Glover et al. | 714/769 |
| 4,730,321 A | * | 3/1988 | Machado | 714/756 |
| 5,359,468 A | * | 10/1994 | Rhodes et al. | 360/48 |
| 5,408,477 A | * | 4/1995 | Okada et al. | 714/755 |
| 5,453,997 A | * | 9/1995 | Roney, IV | 714/774 |
| 5,600,662 A | * | 2/1997 | Zook | 714/769 |
| 5,687,182 A | * | 11/1997 | Shikakura | 714/774 |
| 5,867,510 A | * | 2/1999 | Steele | 714/758 |
| 5,974,580 A | * | 10/1999 | Zook et al. | 714/55 |
| 6,032,283 A | * | 2/2000 | Meyer | 714/746 |
| 6,038,679 A | * | 3/2000 | Hanson | 714/5 |

OTHER PUBLICATIONS

Stephen G. Wilson, "Digital Modulation and Coding", 1996, CH. 5, pp. 470–472, Prentice–Hall, New Jersey.
Shu Lin and Daniel J. Costello, Jr., "Error Control Coding Fundamental and Applications", CH. 6, pp. 167–174, Published 10–82, © 1983, Prentice–Hall, Englewood Cliff, New Jersey.
Unknown, "Chapter 1, Introduction", from The History of Error–Control Coding.
N. Glover and T. Dudley, "Practical Error Correction Design for Engineers", 1991 Cirrus Logic, Inc., CO, Rev. 2nd Ed.
W.W. Peterson and E.J. Weldon, Jr., "Error–Correcting Codes", 1972, (12th printing 1994), Mass. Inst. of Technology, pp. 131–136.

* cited by examiner

Primary Examiner—Ayaz Sheikh
Assistant Examiner—Frantz B. Jean
(74) Attorney, Agent, or Firm—Martine & Penilla, LLP (57) ABSTRACT

Disclosed is method and apparatus for error code correction using product code. The method includes: (a) reading a data frame and associated check bytes from a media; (b) generating an error correction model for the data frame and associated check bytes, where the error correction model is defined by non-zero syndromes in the check bytes of Q dimension code words and P dimension code words of the data frame; (c) examining the generated error correction model; and (d) correcting the data frame using a combination of error correction systems that are selected based on the examining of the generated error correction model.

5 Claims, 11 Drawing Sheets

FIG. 1A
(Prior Art)

| # of Errors | Correction System | Syndrome Equations |
|---|---|---|
| One Error Case | SEC or EC | $S_0 = E_{pattern}$<br>$S_1 = E_{pattern} \alpha^L$ |
| Two Error Case | EC only | $S_0 = E_{pattern1} + E_{pattern2}$<br>$S_1 = E_{pattern1} \alpha^{L1} + E_{pattern2} \alpha^{L2}$ |

ERROR CORRECTION METHOD

BACKGROUND OF THE INVENTION

1. Field of the Invention

This invention relates generally to error correction techniques, and more particularly to improved methods for correcting errors in data that is read from a physical medium.

2. Description of the Related Art

To maintain an acceptable level of data integrity, many types of error correction codes are commonly used. Generally, data that is stored on a physical media is encoded with data patterns that enable decoding systems to identify and correct errors that may be introduced during a reading, processing or transferring operation. In optical storage media applications, there are many factors that contribute to the introduction of errors. Some factors include media defects (i.e., such as damaged compact disc surfaces), electronic noise, component failures, poor electrical connections, and deterioration due to age. Because errors are so common, there is an ever increasing need for error correction systems that are powerful enough to correct complex error combinations, and fast enough to meet the performance demands of today's computer systems.

Figure 1A:
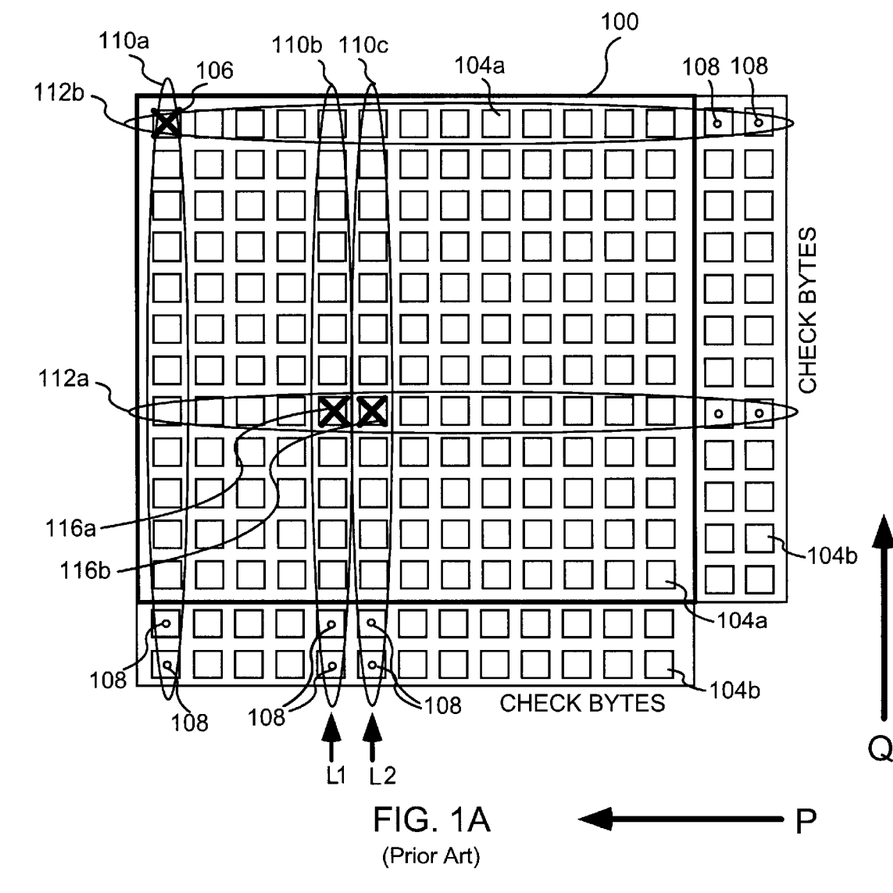
FIG. 1A shows a conventional data frame having a plurality of data bytes and associated check bytes.

In optical data storage media, error correction techniques and systems are typically performed on a "per-fame" basis, where each frame has its data arranged in an array format. For ease of discussion, FIG. 1A shows a data frame 100 having a plurality of data bytes 104a and associated check bytes 104b. The data bytes 104a are arranged in Q code words 110a, 110b, and 110c, which are aligned in a vertical dimension along the data frame 100. In a similar manner, P code words 112a and 112b are aligned in a horizontal dimension along the data frame 100. When an error data byte 106 is detected in the data frame 100 after performing an error correction code (ECC) operation, the check bytes 104b will reflect a non-zero syndrome 108, which indicates the presence of an error.

For example, when the error data byte 106 is detected after performing the ECC operation, non-zero syndromes 108 will be detected along both a Q code word 110a and a P code word 112b. In a similar manner, when error data bytes 116a and 116b are detected in the data frame 100 after performing an ECC operation, respective non-zero syndromes 108 will be detected in the check bytes in both the Q code words 110b and 110c, and the P code word 112a. As should be familiar to those skilled in the art of error correction techniques, the above described ECC operations implement well known two-dimensional (i.e., Q and P dimensions) product code to protect the data that is stored on the media. For more information on product code, reference may be made to a book entitled "Error-Correcting Codes" by W. Wesley Peterson and E. J. Weldon, Jr. (1972), and a book entitled "Practical Error Correction Design for Engineers" by Neal Glover and Trent Dudly, p. 271 (1991). These books are herein incorporated by reference in their entirety.

When product code with two check bytes is used, there are four commonly used tools that may be implemented in the correction of detected error data bytes. For example, there is single error correction (SEC) system where the location and pattern are not known, that may be used for the P dimension (i.e., SEC P) and the Q dimension (i.e., SEC Q). There is also what is known as an erasure correction (EC) system where the location is known, but the pattern is not, which is also implemented in the P dimension (i.e., EC P) and in the Q dimension (i.e., EC Q).

In general, one or more of the four error correction systems may be used in correcting errors. However, an error correction system is generally best selected depending on the number of errors that are detected along a particular code word. For example, the single error correction (SEC) system is optimized to correct only one error data byte at a time along a particular code word. This is true because single error correction systems are only required to solve simple syndrome equations.

Figure 1B:
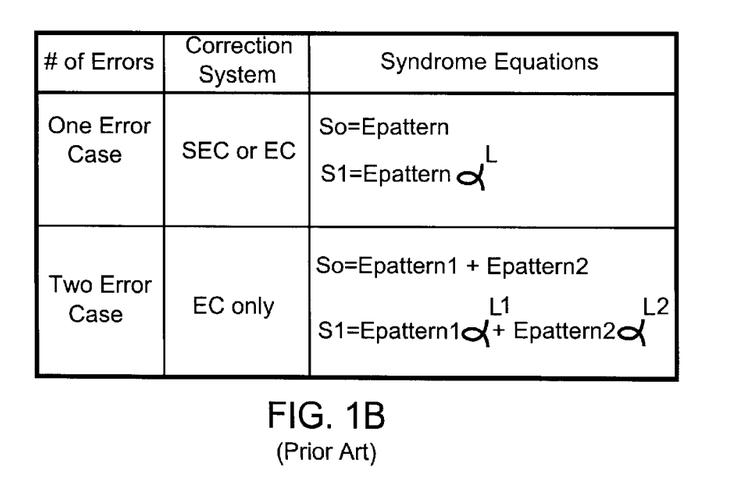
FIG. 1B is a table of syndrome equations for a single error case and a two error case.

On the other hand, when there is more than one error data byte along a particular code word, the simple syndrome equations may not work, and in some cases, additional errors may be introduced. To remedy this, erasure correction (EC) systems that implement more complex syndrome equations are used. In EC correction systems, the syndrome equations are solved by plugging in the location (L) values for each of the code words in which the error data bytes are detected. By way of example, in FIG. 1A two error data bytes 116a and 116b lie along the P code word 112a. When the locations L for the Q code words 110b and 110c are plugged into the syndrome equations of FIG. 1B, the error data bytes can be corrected.

Single error correction (SEC) systems are therefore best used in cases where there is only one error data byte along a particular code word, and when there is more than one error data byte along a particular code word, the erasure correction (EC) systems should be used. Unfortunately, conventional correction schemes are not configured to use the best correction system to process each unique error pattern, and therefore, often fail to produce an acceptable level of correction. In fact, most hardware error correction implementations are programmed to correct a given data frame 100 with only one or two error correction systems, without first examining which scheme is best suited for the detected errors. As a result, many correctable errors will necessarily be marked as un-correctable because only a subset of all possible correction systems will be performed.

Although software-only error correction can be used to increase the number of error correction systems used in correcting a given data frame 100, software error correction is very computationally intensive. As a result, software-only error correction has the known detrimental effect of further burdening a computer's microprocessor. In addition, most optical drive applications will also require an additional microprocessor, microcontroller, or digital signal processor to perform some of the correction operations. Consequently, software-only implementations have been less than adequate for commercial use.

In view of the foregoing, what is needed is an error correction system that is implemented in hardware, yet provides the flexibility of using custom correction systems that are optimally suited to correct the errors detected in a particular data frame.

SUMMARY OF THE INVENTION

Broadly speaking, the present invention fills these needs by providing a method and apparatus for performing intelligent error correction. It should be appreciated that the present invention can be implemented in numerous ways, including as a process, an apparatus, a system, a device, a method, or a computer readable medium. Several inventive embodiments of the present invention are described below.

In one embodiment, a method for error code correction using product code is disclosed. The method includes: (a) reading a data frame and associated check bytes from a media; (b) generating an error correction model for the data frame and associated check bytes, where the error correction model is defined by non-zero syndromes in the check bytes of Q dimension code words and P dimension code words of the data frame; (c) examining the generated error correction model; and (d) correcting the data frame using a combination of error correction systems that are selected based on the examining of the generated error correction model.

In another embodiment, an apparatus for performing error correction using product code stored on a physical medium is disclosed. The apparatus includes an error correction code sequencer, and a memory block that is integrated with the error correction code sequencer. The memory block is configured to store a plurality of combinations of error correction systems. The apparatus further includes a decoder processor that is in communication with the physical medium, and a digital signal processor that is in communication with a programmable memory device. The programmable memory device is configured to select one of the plurality of combinations of error correction systems when the error correction code sequencer examines an error correction model of a data frame that is read from the physical medium.

In yet a further embodiment, a system for error code correction using product code is disclosed. The system includes means for reading a data frame and associated check bytes from a media, and means for generating an error correction model for the data frame and associated check bytes. The error correction model is defined by non-zero syndromes in the check bytes of Q dimension code words and P dimension code words of the data frame. The system further includes means for examining the generated error correction model, and means for correcting the data frame using a combination of error correction systems that are selected based on the examining of the generated error correction model.

In still a further embodiment, a method for encryption protecting data stored on an optical media is disclosed. The data is encrypted with a custom error pattern. The method includes reading the optical media to obtain a special code that contains the custom error pattern. Transferring the special code to a host computer to enable future access to the optical media by the host computer that has the special code. The method further includes error correcting at least one data frame of the optical media using a combination of error correction systems that are predetermined to correct the custom error pattern. Preferably, the error correcting is allowed when the host computer that has the special code makes a request for the at least one data frame of the optical media.

In another embodiment, a system for encryption protecting data that is stored on an optical media is disclosed. The data is first encrypted with a custom error pattern. The system includes means for reading the optical media to obtain a special code that contains the custom error pattern, and means for transferring the special code to a host computer to enable future access to the optical media by the host computer that has the special code. The system further includes means for error correcting at least one data frame of the optical media using a combination of error correction systems that are predetermined to correct the custom error pattern.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a method and apparatus for performing intelligent error correction of in data that is read from a physical medium. In the following description, numerous specific details are set forth in order to provide a thorough understanding of the present invention. It will be obvious, however, to one skilled in the art, that the present invention may be practiced without some or all of these specific details. In other instances, well known process operations have not been described in detail in order not to unnecessarily obscure the present invention.

In one embodiment of the present invention, product code error correction operations are performed using a variety of combinations of an SEC P, an SEC Q, an EC P and an EC Q error correction system, after the errors are examined to produce an error correction model. Thus, by examining the produced error correction model, it is possible for the hardware to select a combination of error correction systems that are optimally suited to correct a particular data frame. As will be described in greater detail below, this error correction implementation can be used: (1) to perform error correction on a medium until a predetermined minimum level of correction is achieved; (2) to perform error correction on a single data frame until absolute correction is achieved; and (3) to perform encryption (i.e., compact disc copy protection) operations based on designed error patterns that are only correctable with a combination of error correction systems that are also custom designed (i.e., and known) to decode the designed error patterns.

Although the error correction techniques disclosed herein make efficient use of the high speed processing capability of dedicated hardware circuitry, these correction techniques may also be performed in software. In either case, the following correction techniques have the true advantage of intelligently examining detected error patterns, and then performing corrections in each of the two product code dimensions with those error correction systems that are optimally suited to correct the detected error patterns.

Figure 2:
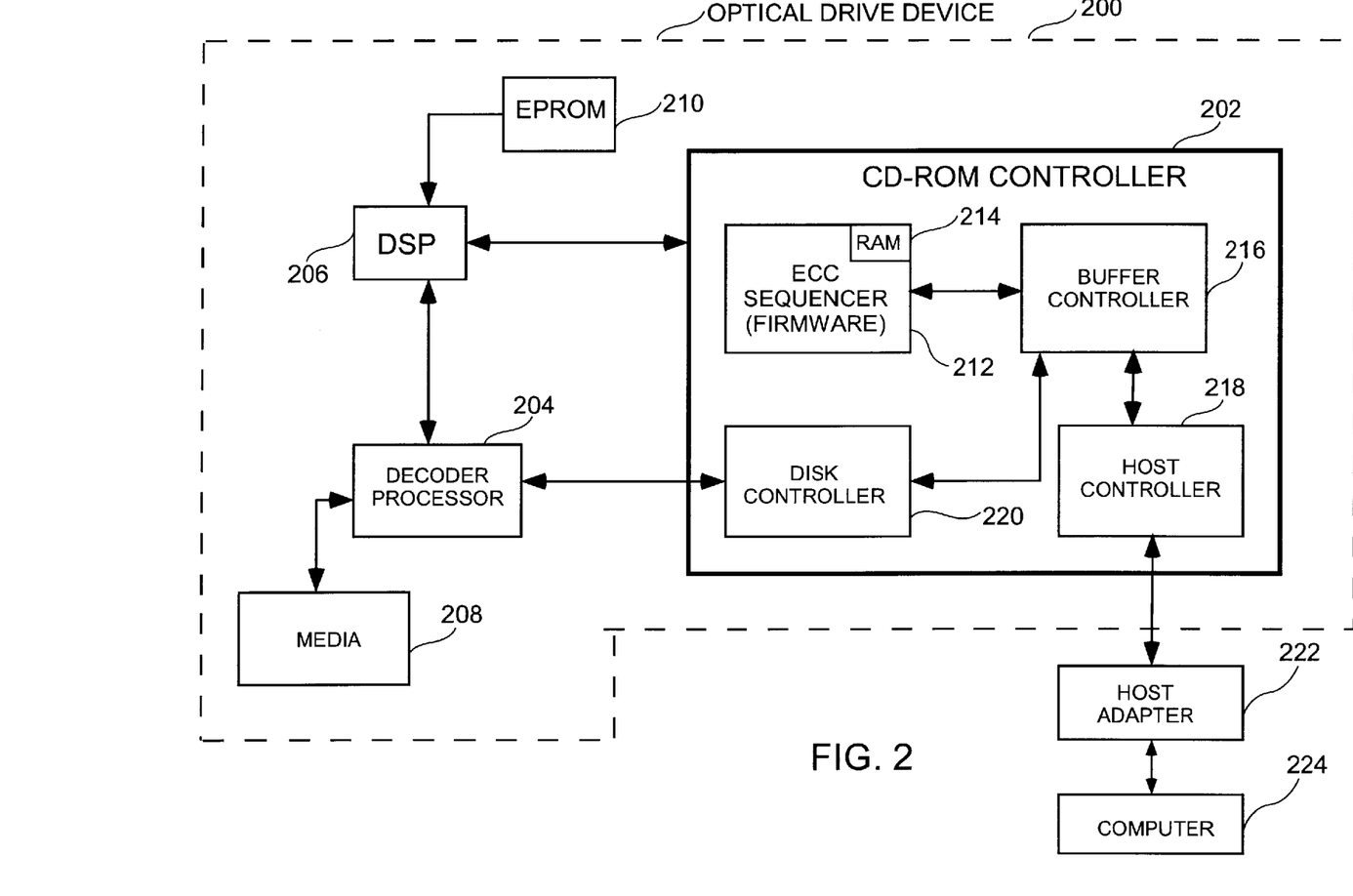
FIG. 2 shows a block diagram of several hardware components that are integrated into a optical drive device in accordance with one embodiment of the present invention.

FIG. 2 shows a block diagram of several hardware components that are integrated into a optical drive device 200, in accordance with one embodiment of the present invention. As shown, the optical drive device 200 is coupled to a computer 224 via a host adapter 222. The host adapter 222 then communicates with a host controller 218 that is contained within a CD-ROM controller 202. The optical drive device 200 of this example is an optical CD ROM drive, although other optical drives, such as digital video disc (DVD) drives may also benefit from the intelligent error correction techniques of the present invention.

The optical drive device 200 includes a digital signal processor (DSP) that is coupled to an EPROM memory device 210. The DSP 206 is also coupled to the CD-ROM controller 202 and a decoder processor 204. The decoder processor 204 is likewise coupled to a media 208 and a disc controller 220 of the CD-ROM controller 202. In general, the media 208 may be any optical media, such as a compact disc, a DVD disc, or the like. However, the storage media is not limited to optical media, but may include other storage media such as hard disks, magnetic tapes, and other removable media. The disk controller 220 of the CD-ROM controller 202 is connected to a buffer controller 216. The buffer controller 216 is likewise connected to the host controller 218.

In one embodiment, the CD-ROM controller includes an error correction code (ECC) sequencer 212, which includes firmware logic for performing product code error correction. The ECC sequencer 212 has a RAM 214 memory that is configured to hold a plurality of error correction system combinations. As will be described in greater detail below, each of the error correction system combinations are selected after an error correction model of a given data frame has been examined. The various error correction system combinations are preferably stored in the RAM 214 memory, of which an example is shown below in Table A.

TABLE A

Commands Stored In RAM 214

| | |
|---|---|
| 0 | SEC P (single error correction P codeword) |
| 1 | SEC Q (single error correction Q codeword) |
| 2 | EC P (first 2 non-zero q syndromes are used as the p locations) |
| 3 | EC Q (first 2 non-zero p syndromes are used as the q locations) |
| 4 | EC CBQ (the 2 q check byte locations are used as the q locations to be erased) |
| 5 | CNT_PQ (count how many non-zero p and how many non-zero q syndromes there are) |
| 6 | CNT_P (count how many non-zero p syndromes there are) |
| 7 | CNT_Q (count how many non-zero q syndromes there are) |
| 8 | Execute next instruction if statement is true: p < p_cnt |
| 9 | Execute next instruction if statement is true: p = p_cnt |
| 10 | Execute next instruction if statement is true: q < q_cnt |
| 11 | Execute next instruction if statement is true: q = q_cnt |

TABLE A-continued

Commands Stored In RAM 214

| | |
|---|---|
| 12 | JUMP |
| 13 | LD_RPT_CTR |
| 14 | DEC RPT_CTR and LOOP (decrement counter and loop to address specified) |
| 15 | NOP |

In general, the number of errors and their location along each dimension of a data frame are first examined, an error correction model is produced by examining where non-zero syndromes reside along each dimension, and then the error correction model is examined to determine an optimal error correction system combination. For example, if only one error data byte is detected in a particular data frame, then only single error correction (SEC) system in either the P or the Q dimension should be used by the ECC sequencer 214 to perform the correction. The logical operations performed by the ECC sequencer 212 of the present invention will be described with greater detail with reference to the following figures.

Figure 3:
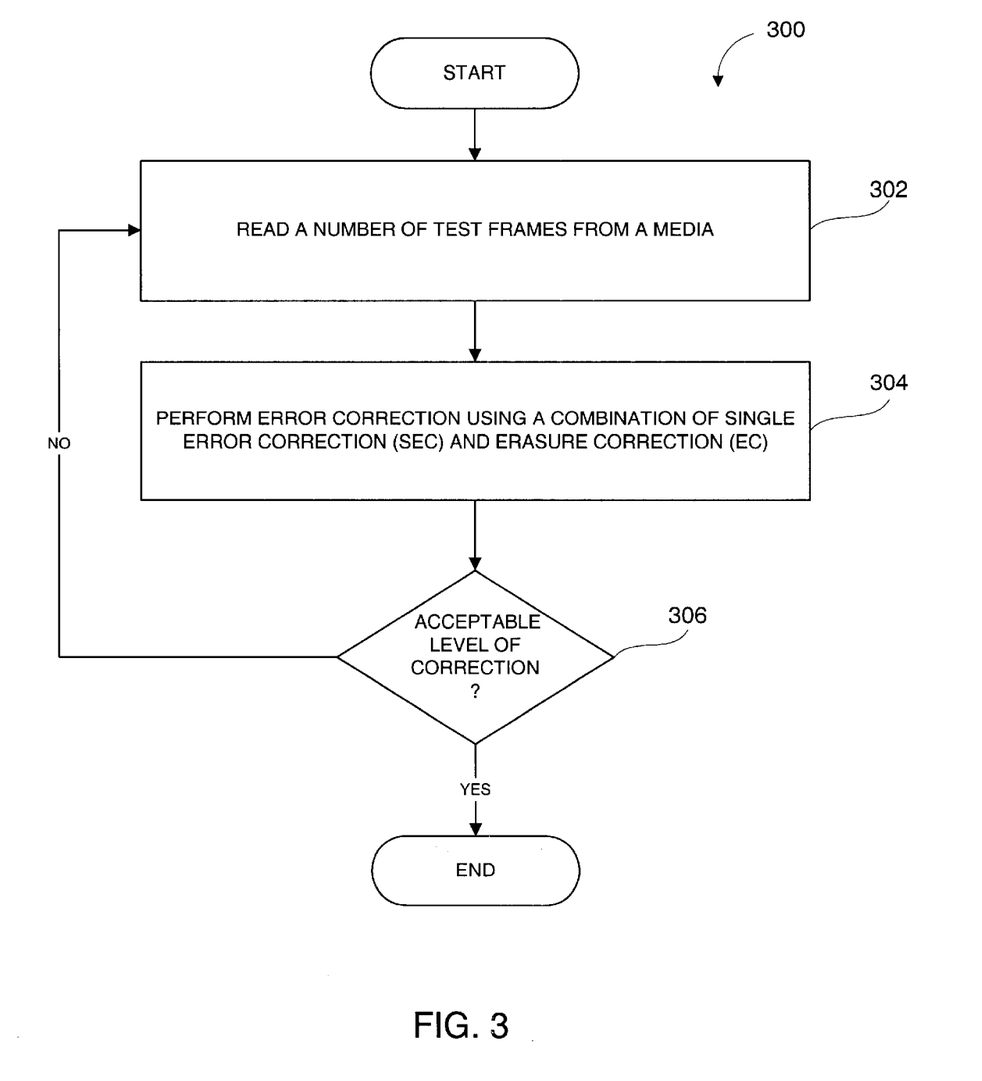
FIG. 3 shows a flowchart diagram illustrating the method operations performed by the ECC sequencer in accordance with one embodiment of the present invention.

FIG. 3 shows a flowchart diagram illustrating the method operations performed by the ECC sequencer 212 in accordance with one embodiment of the present invention. The method begins at an operation 302 where a number of test data frames are initially read from the media 208. By way of example, 1,000 frames may be read from a given media to determine which correction combination is best suited for correcting the type of errors found on the 1,000 frames. Based on the results obtained from the 1,000 frames, the correction system combination can be "tuned" to achieve a predetermined level of correction. Therefore, once the number of frames have been read from the media 208 in operation 302, the method will proceed to an operation 304.

In operation 304, error correction using a combination of single error correction (SEC) and erasure correction (EC), is performed on the number of test frames read from the media. Next, the method proceeds to a decision operation 306 where it is determined if an acceptable level of correction has been reached. By way of example, if about 990 frames were adequately corrected with the initially chosen combinations of SEC and EC correction systems, then the method will end. On the other hand, if less than about 990 frames were adequately corrected by the chosen combination of SEC and EC correction systems, the method will proceed back to operation 302. In operation 302, the same frames will again be read from the media and processed through operation 304.

However, the next time processing is performed through operation 304, a new combination of SEC and EC correction systems will be used. Then the method will proceed to a decision operation 306 until the acceptable level of correction has been reached. It should be understood that the acceptable level of correction may be set to any level, depending on the desired requirements for a particular application.

Figure 4A:
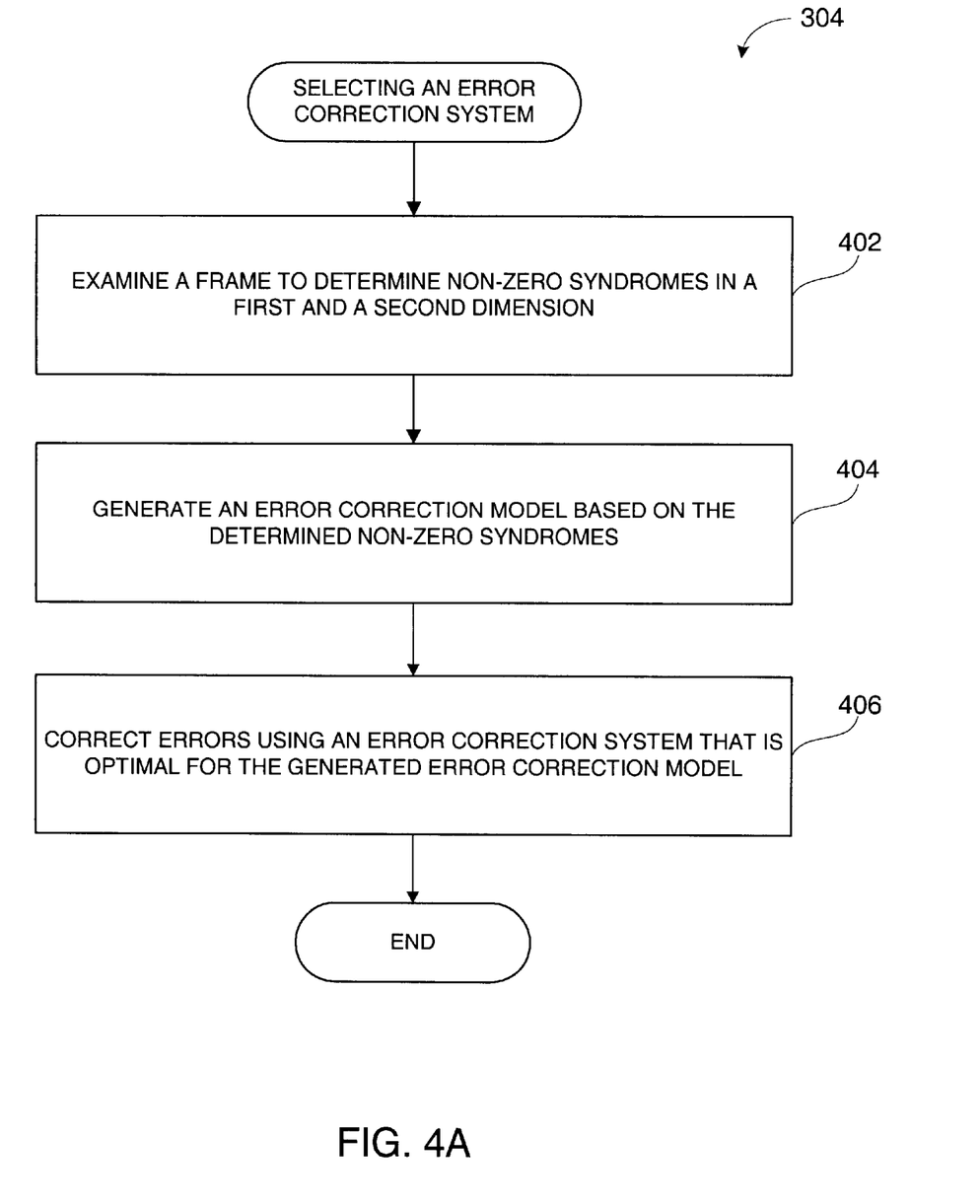
FIG. 4A shows a more detailed flowchart diagram illustrating the method operations performed in selecting an error correction system in accordance with one embodiment of the present invention.

FIG. 4A shows a more detailed flowchart diagram illustrating the method operations performed in operation 304 for selecting an error correction system in accordance with one embodiment of the present invention. The method begins at an operation 402 where a frame is examined to determine all of the non-zero syndromes in the check bytes along a first and a second dimension. As mentioned above, data frames in product code correction will typically have a P dimension along a horizontal direction and a Q dimension along a vertical direction.

Thus, when an error correction code (ECC) operation is performed over a data frame including the check bytes, those check bytes that lie along a particular code word will have "non-zero syndromes" when an error data byte exists in that particular code word. For example, in FIG. 1A, non-zero syndromes 108 are present in the check bytes that align with the error data byte 106 (i.e., along the Q code word 110a, and the P code word 112b). Accordingly, once all of the non-zero syndromes in a particular frame have been ascertained, the method proceeds to an operation 404. In operation 404, an error correction model is generated based on the found non-zero syndromes.

The error correction model will identify the horizontal rows and the vertical columns in which error data bytes exist, and identify the associated non-zero syndromes in the check bytes. Once the error correction model has been generated based on the determined non-zero syndromes, the method proceeds to an operation 406 where the errors are corrected using a combination of error correction systems that are optimally selected based on the generated error correction model. As mentioned above, the combination of error correction systems may include an SEC P error correction system, an SEC Q error correction system, an EC P error correction system, and an EC Q error correction system. Accordingly, in cases where there is more than one error data byte along a particular code word, the optimal correction technique should be to use an EC correction system. For completeness, exemplary EC correction system equations for associated syndromes are provided below in Tables B and C, however, it should be understood that there may also be cases where more than two errors occur. In such cases, additional well known syndrome equations can be used to handle those cases.

TABLE B (EC) Erasure Decoding Computations
[Syndromes for two errors]

$S_0$ = Epattern1 $\oplus$ Epattern2
$S_1$ = Epattern1$\alpha^{loc1}$ $\oplus$ Epattern2$\alpha^{loc2}$

TABLE C

Erasure Decoding Computations
Solving for Epattern1 & Epattern2

When $\alpha^{loc1}$ and $\alpha^{loc2}$ are fixed numbers:
Epattern1 = $(S_1 \oplus S_0\alpha^{loc2})/(\alpha^{loc1} \oplus \alpha^{loc2})$
Epattern2 = $(S_1 \oplus S_0\alpha^{loc1})/\alpha^{loc1} \oplus \alpha^{loc2})$ Of course, in cases where there is only one error data byte along a particular code word, it will be more beneficial to at least initially use an SEC correction system. During operation, correction for a particular dimension is performed on all code words that lie along one dimension, and then correction will be performed along the other dimension, over all of those code words. Therefore, if there are code words in which there is only one error data byte, and code words that have more than one error data byte in the same dimension, the SEC correction system (that is optimal for the single error correction) should first be performed over all code words in that dimension. When this is done, the SEC correction system will necessarily be performed over code words that have more than one error data bytes.

As a result, the SEC correction system may introduce new errors (i.e., error data bytes 107a and 107b of FIG. 4D below) along the code word that has more than one error data byte. To remedy this, the correction technique should then shift to the other dimension and perform a single error correction (SEC) over all of those code words, including those code words that have more than one error data byte. As was the case in the other dimension, the single error correction (SEC) system may also introduce new error data bytes along some code words. Once single error correction (SEC) has been performed in both dimensions, another single error correction (SEC) may be performed in both dimensions. Once the number of optimum single error corrections in both dimensions have been performed, an erasure correction (EC) system may then be used in both dimensions (and repeated if necessary) until the desired level of correction is achieved.

Alternatively, if the error correction model that was generated based on the determined non-zero syndromes in operation 404 reveal that there were no single errors data bytes along any of the code words in either dimension, it will be more suitable to only perform EC correction in both dimensions, without initially attempting to correct the data frame with the single error correction (SEC) system. Accordingly, because the error correction model is first examined to determine the location and the number of error data bytes in a particular data frame before the correction operations are performed, the most efficient error correction systems can be used. Once the errors are corrected using the error correction systems that are optimal for the generated error correction model in operation 406, the method will end.

Figure 4B:
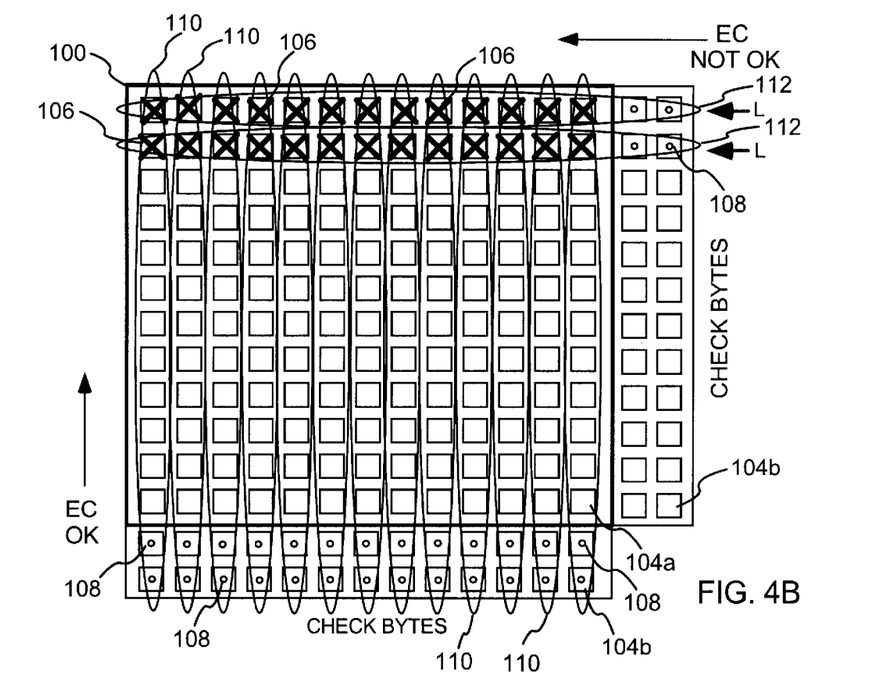
FIG. 4B shows a generated error correction model of a data frame having a plurality of data bytes and check bytes in accordance with one embodiment of the present invention.

FIG. 4B shows a data frame 100 having a plurality of data bytes 104a and check bytes 104b in accordance with one embodiment of the present invention. In this example, once an error correction code (ECC) operation is performed over the data frame 100, a plurality of error data bytes 106 are detected along the uppermost section of the data frame 100. Therefore, respective non-zero syndromes 108 are identified along the check bytes 104b for those code words 110 in the Q dimension, and those code words 112 in the dimension.

At this point, the error correction model defined by the non-zero syndromes 108 is generated. Once the error correction model has been generated, the most optimal error correction system is selected. In this case, it is not optimal to perform the single error correction (SEC) systems in either the P dimension or the Q dimension because there is more than one error data byte 106 along both the Q code words 110 and the P code words 112. In this example, the error correction model will dictate that an erasure correction (EC) system will most efficiently correct the data frame 100. In addition, the error correction model also suggests that the EC correction systems first be performed in the Q dimension. This is because there are only two error data bytes along the code words 110, while there are more than two error data bytes along the P code words 112.

Figure 4C:
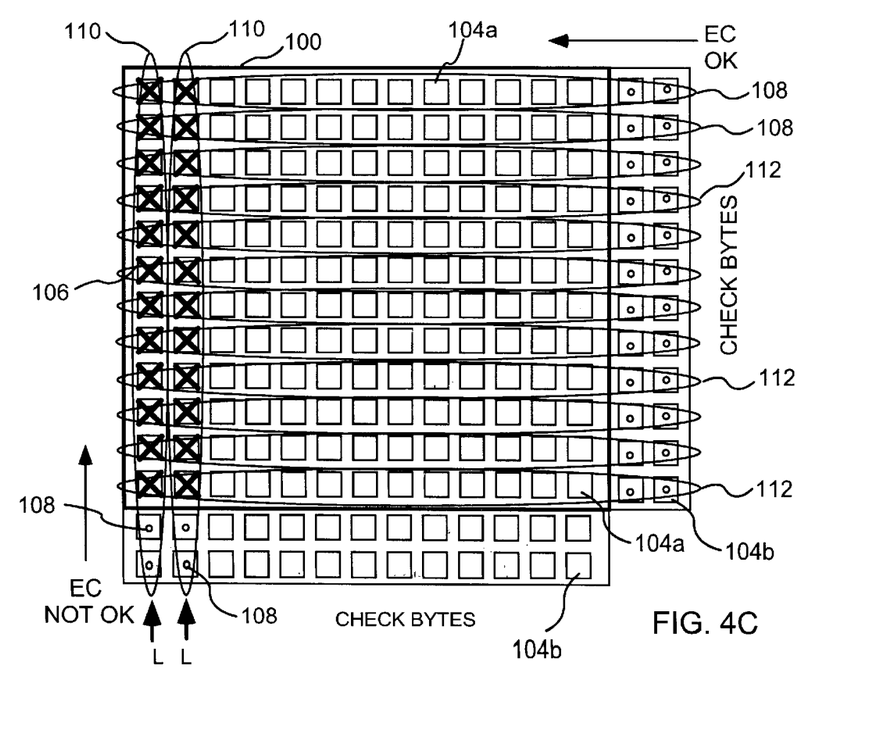
FIG. 4C is another example of a generated error correction model in accordance with one embodiment of the present invention.

FIG. 4C shows another example of a generated error correction model in accordance with one embodiment of the present invention. In this case, the Q code words 110 at the leftmost portion of the data frame have all of the error data bytes. Once this model has been determined, a determination is made as to the optimal error correction system to use in each dimension. In this case, the single error correction technique will not be an optimal technique for correcting code words in either the P dimension or the Q dimension. Also, the EC correction system will not be optimally suited to correct the error data bytes along the Q code words 110, because there are more than two error data bytes 106 along the Q code words 110. Thus, the optimal correction system will be to first use an EC correction system in the P dimension along the P code words 112. Of course, the locations "L" can be substituted into the syndrome equations in order to solve for the error patterns.

Figure 4D:
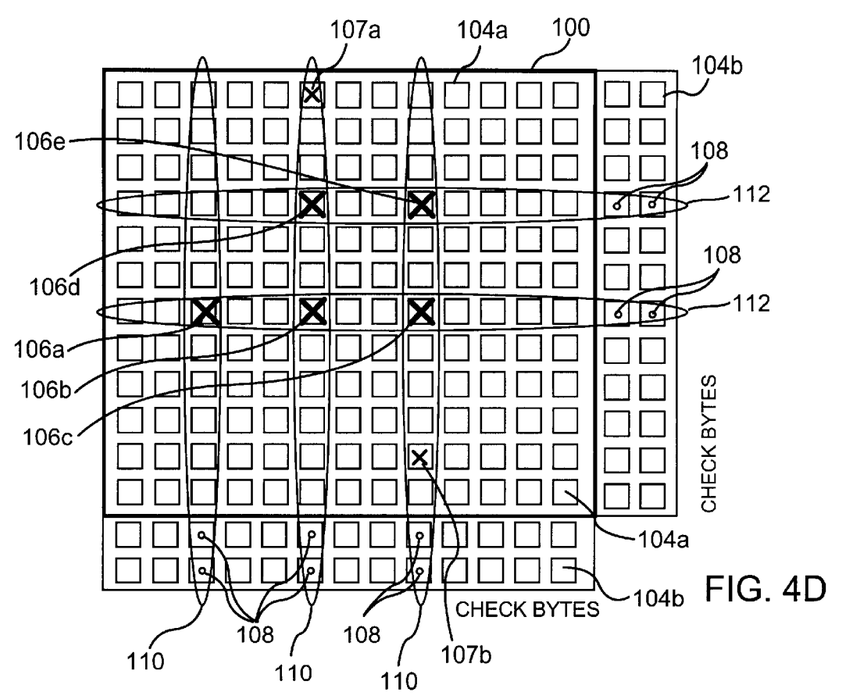
FIG. 4D is yet another example of a generated error correction model in accordance with one embodiment of the present invention.

FIG. 4D shows an example of another error correction model in accordance with one embodiment of the present invention. Once the ECC operation has been performed, the non-zero syndromes 108 in the check bytes 104b will be used to create the error correction model. In this example, the error correction model will include three Q code words 110 and two P code words 112. The first code word 110 from the left has only a single error data byte 106a, while the next two Q code words 110 have two error data bytes, respectively. The first P code word 112 from the top only has two error data bytes, and the second P code word 112 has three error data bytes.

Once this error correction model has been generated, the most optimum error correction system is selected to correct the error data bytes. In this example, it will be optimal to first perform a single error correction (SEC) operation along the Q dimension to correct the error data byte 106a. However, when the Q code word 110 that includes the error data bytes 106b and 106d is corrected using the single error correction technique, the single error correction technique may introduce an additional error data byte 107a along that Q code word 110.

This may also occur when the Q code word 110 having the error data bytes 106c and 106e are corrected using the single error correction system. Once the single error correction system has been performed along the Q dimension, the single error correction system may next be performed along the P dimension. By performing the single error correction in the P dimension first, any error data bytes, such as error data bytes 107a and 107b that were inadvertently introduced during the single error correction along the Q dimension, can be corrected.

Once the single error correction operation is performed along the P dimension, the EC correction system can be performed to correct those code words that have two error data bytes. For example, in the P code words 112, error data bytes 106d and 106e and error data bytes 106b and 106c can be corrected using the EC correction systems. It should be appreciated that by first determining what the error correction model is based on the determined non-zero syndromes, it will be possible to select the most optimal error correction combination, which takes advantage of the respective beneficial aspects of SEC and EC correction.

Figure 4E:
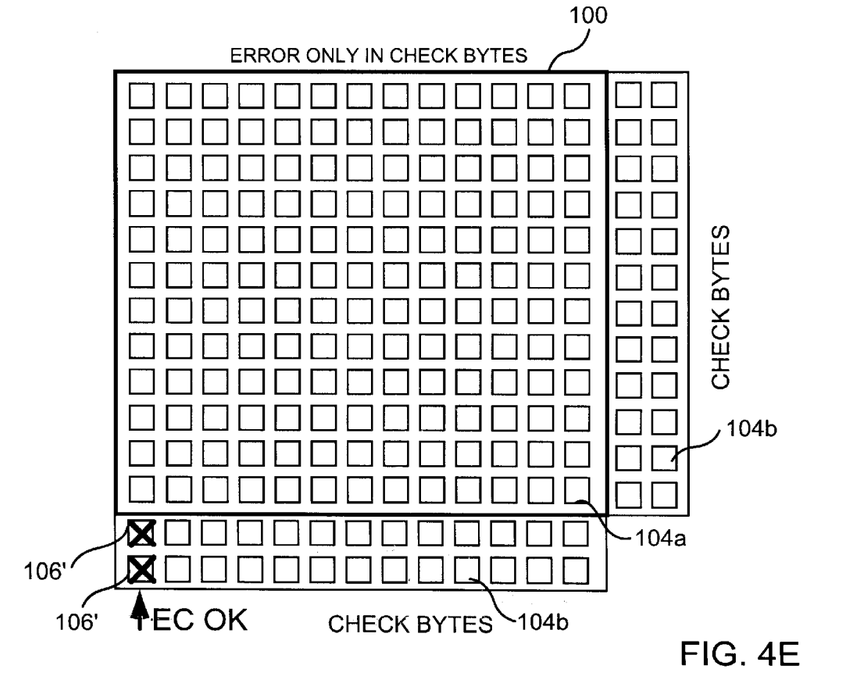
FIG. 4E is an example of a data frame that only has detected error check bytes in accordance with one embodiment of the present invention.

FIG. 4E is an example of a data frame 100 that has no error data bytes detected in the data frame after an ECC operation is performed in accordance with one embodiment of the present invention. For example, because there are no non-zero syndromes 108 in the check bytes 104b, no error correction model will be generated. However, error correction may still be performed to correct the check byte errors 106'. In this example, it will be determined that the best error correction technique will be to use an EC correction system along the Q dimension.

Figure 4F:
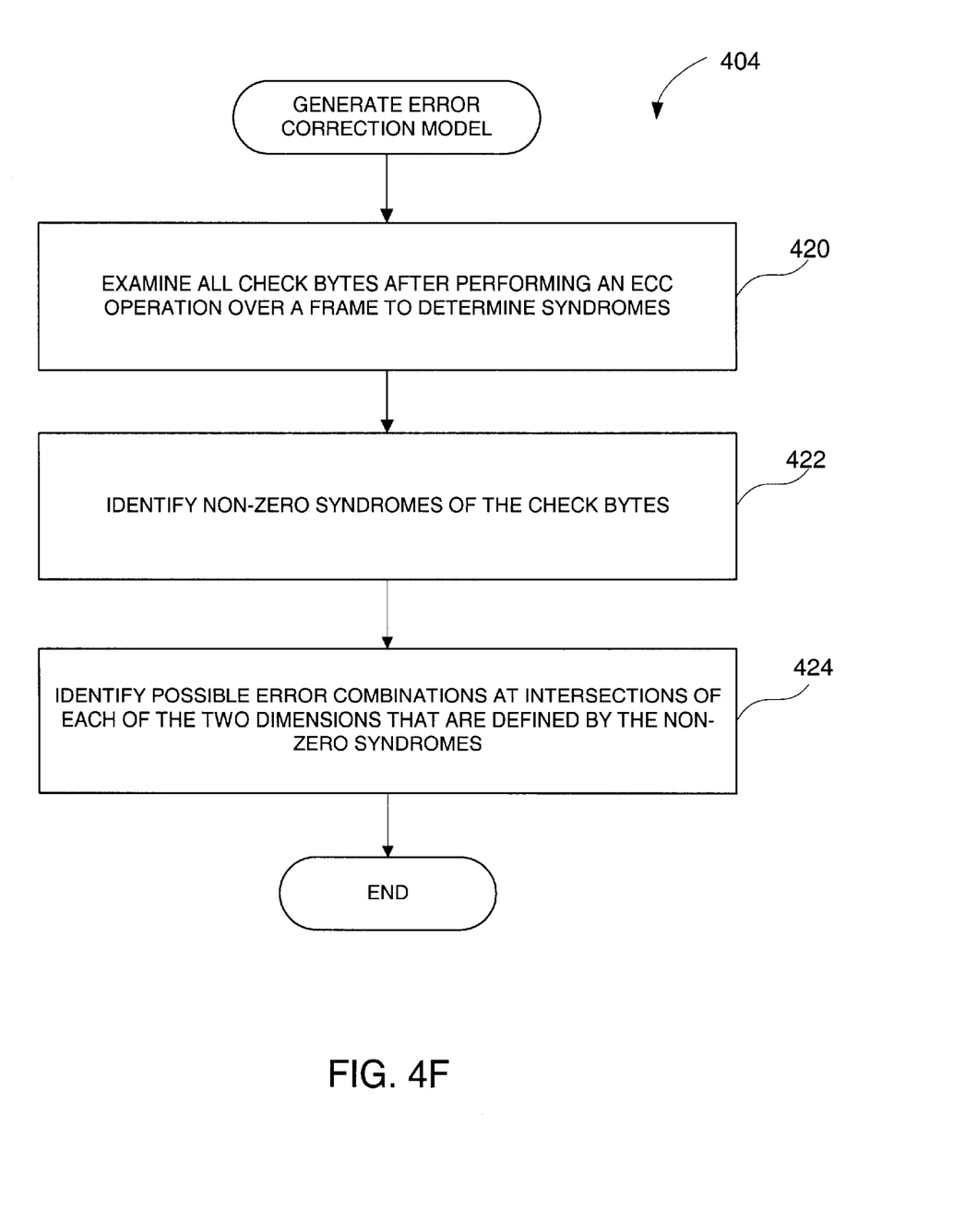
FIG. 4F is a flowchart diagram illustrating in more detail the method operations performed in generating an error correction model in accordance with one embodiment of the present invention.

FIG. 4F shows a flowchart diagram illustrating in more detail the method operations performed in generating an error correction model 404 in accordance with one embodiment of the present invention. The method begins at an operation 420 where all check bytes are examined after performing an ECC operation over a frame to determine the syndromes. Once the check bytes have been examined, the method proceeds to an operation 422 where all non-zero syndromes of the check bytes are identified. As shown in FIG. 4D above, only selected check bytes have non-zero syndromes 108, which were detected after the ECC operation was performed over the data frame 100.

The method then proceeds to an operation 424 where all possible error combinations are identified at the intersections of each of the two dimensions that are defined by the non-zero syndromes. As mentioned above with respect to FIG. 4D, certain errors should first be corrected using a single error correction (SEC) system, and then re-correcting the data frame with the erasure correction (EC) system to correct multiple error code words. Once the optimum error correction system combinations have been determined by examining the intersections of the code words having the non-zero syndromes in operation 424, the method of generating the error correction model 404 will end.

Figure 5:
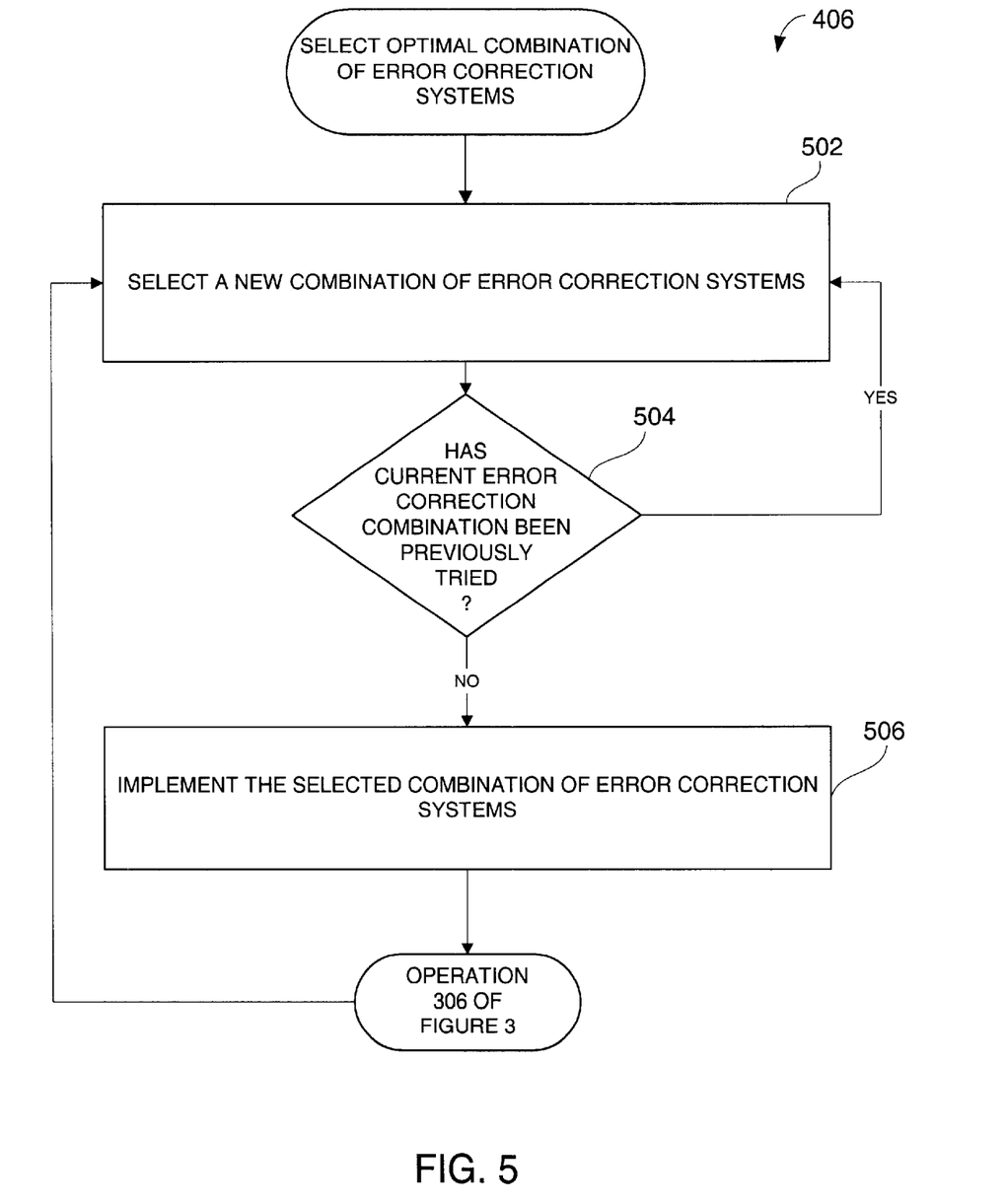
FIG. 5 is a flowchart diagram illustrating the method operations performed in selecting an optimal combination of error correction systems in accordance with one embodiment of the present invention.

FIG. 5 is a flowchart diagram 406, illustrating the method operations performed in selecting an optimal combination of error correction systems in accordance with one embodiment of the present invention. The method begins at an operation 502 where a new combination of error correction systems is selected. As mentioned above, the error correction systems include combinations of SEC P, SEC Q, EC P, and EC Q. Once the new combination of error correction systems that is determined to be the best suited for the generated error correction model is selected in operation 502, the method proceeds to an operation 504. In operation 504, it is determined whether the current combination of error correction systems has been previously tried. If it has, the method proceeds back to operation 502 where another combination of error correction systems is selected.

As mentioned above, another combination of error correction systems may just be another combination of the four types of error correction systems that are commonly used in product code correction. If the current combination of error correction systems has not been previously tried, the method will proceed to an operation 506. In operation 506, the selected error correction system is implemented on the current data frame that has the generated error correction model. Once the selected combination of error correction systems has been implemented, the method will proceed back to operation 306 of FIG. 3.

In operation 306, it is determined whether an acceptable level of correction has been reached for the current frame being corrected. If an acceptable level of correction has not been reach for that particular frame, the method will proceed back up to operation 502 where another combination of error correction systems is selected. Once the new combination of error correction systems is selected, the method will again proceed through decision operation 504, and then to operation 506 if that new combination of error correction systems has not previously been tried. Again, the method will proceed from operation 506 to operation 306 of FIG. 3. Once it is determined in operation 306 that an acceptable level of correction has been reached, the method will end.

Figure 6:
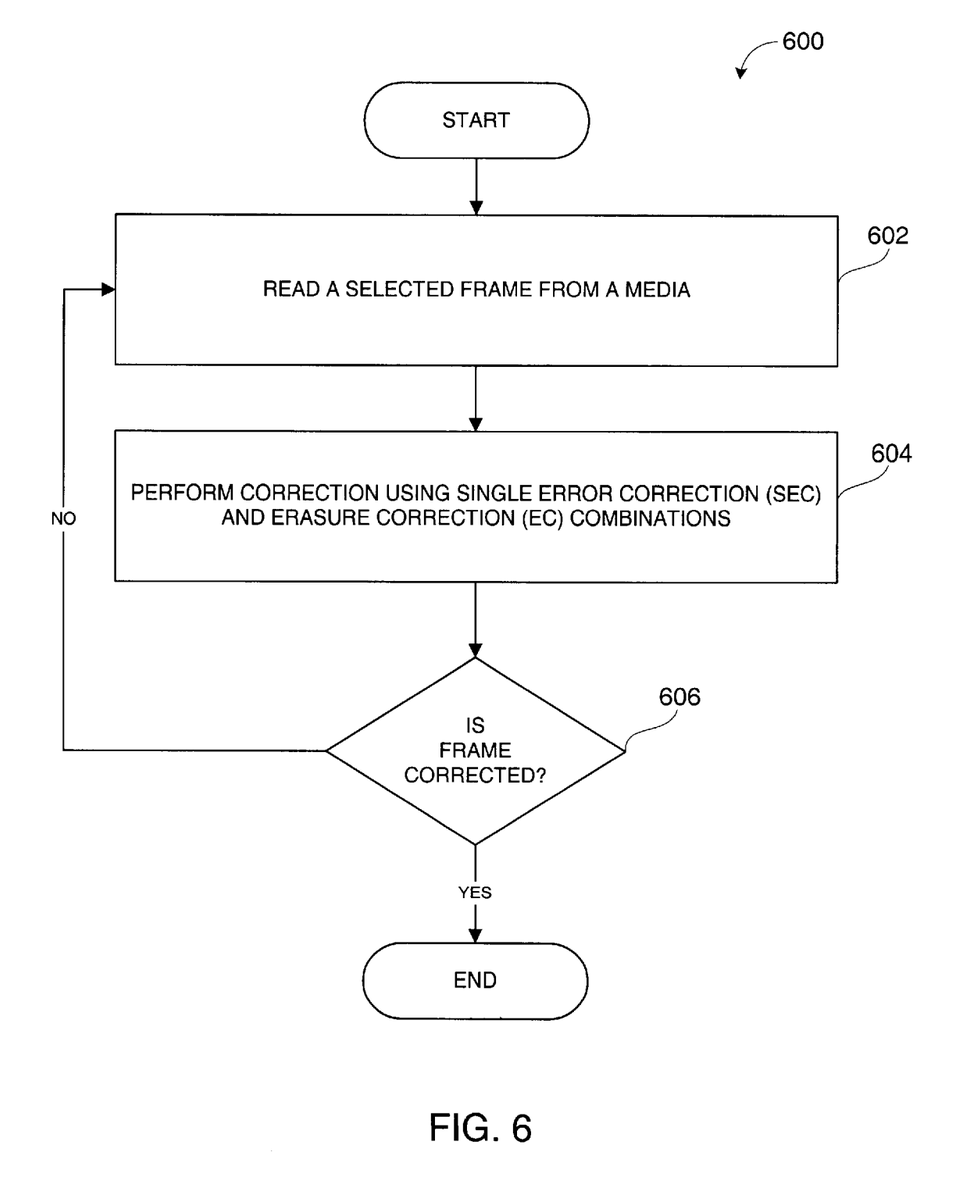
FIG. 6 is a flowchart diagram illustrating the method operations implemented in correcting errors in a single target frame in accordance with one embodiment of the present invention.

FIG. 6 is a flowchart diagram 600 that illustrates the method operations implemented in correcting errors in a single frame in accordance with one embodiment of the present invention. This embodiment describes a correction technique that may be used when a particular frame has errors that are too difficult to correct using conventional correction methods. In general, a data frame can corrected using many combinations of the single error correction (SEC) systems and the erasure correction (EC) systems until correction is achieved. This technique is especially useful in the recovery important data that may have been corrupted.

The method will begin at an operation 602 where a selected frame (i.e., the corrupt frame) is read from the media. Once that frame has been read, the method proceeds to an operation 604 where correction using SEC and EC combinations are performed. In general, these combinations of error correction systems are performed using the method operations described in FIGS. 4A and 4F. That is, the method will first perform the selection of a combination of error correction systems based upon the examination of an error correction model.

Once the correction is performed using the combination of single error correction (SEC) systems and the erasure correction (EC) systems in operation 604, the method will proceed to an operation 606. In operation 606, it is determined whether the frame has been completely corrected. If it has not been completely corrected, the method will again proceed back up to operation 602 where the selected frame is again read. Once the frame is again read in operation 602, the method proceeds through operation 604 and then back to operation 606. Once the frame has been completely corrected, the method will end.

Figure 7:
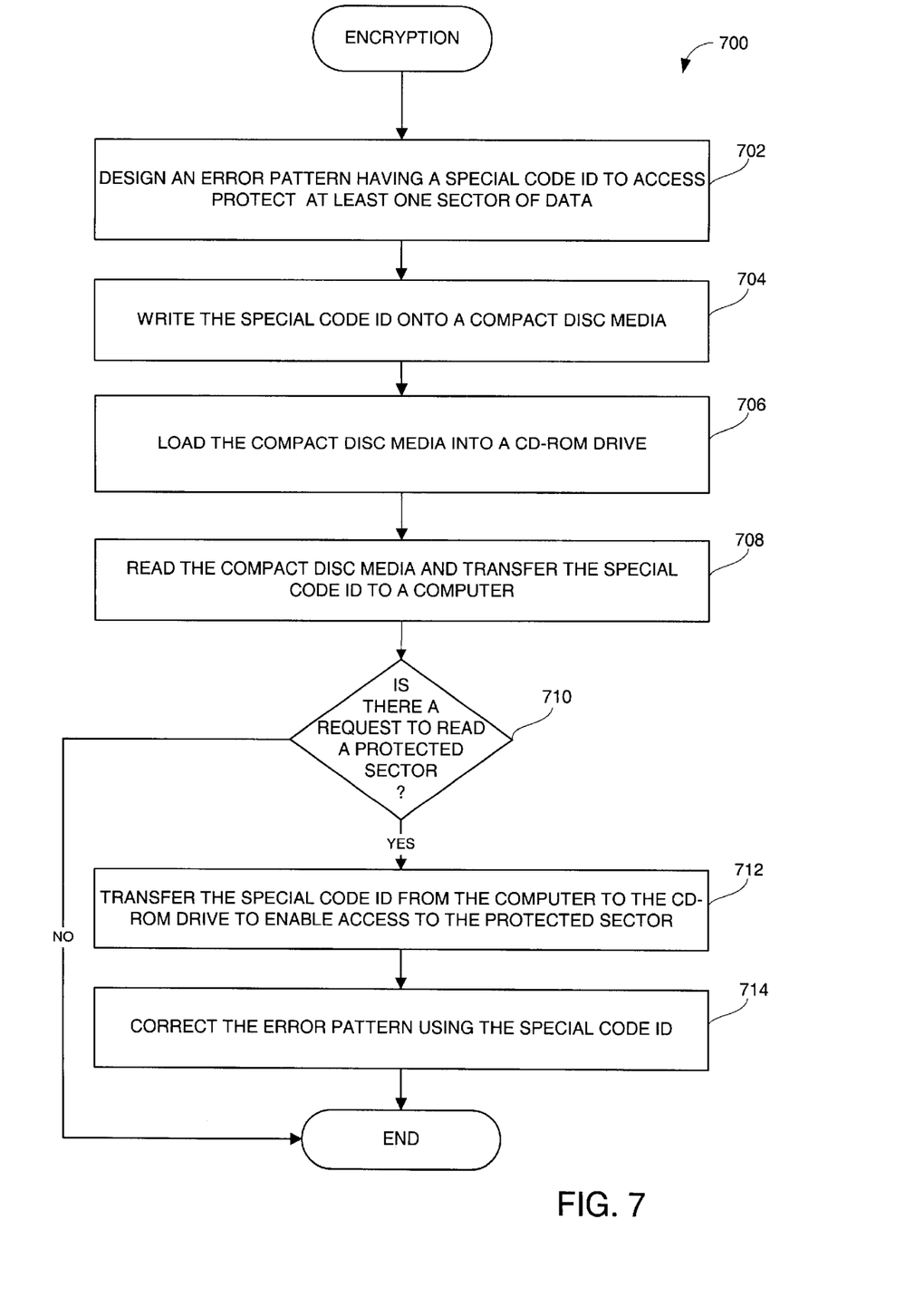
FIG. 7 is a flowchart diagram illustrating the method operations used in performing encryption protection in accordance with another embodiment of the present invention.

FIG. 7 is a flowchart diagram 700 illustrating the method operations used in performing encryption protection in accordance with another embodiment of the present invention. Although the encryption techniques have many applications, one such application is that of "copy protection," which can be performed during the manufacture of the optical medium itself.

The method of flowchart 700 begins at an operation 702 where an error pattern having a special code identification (ID) is designed to access-protect at least one sector of data (or all of the data) that may recorded on a particular compact disc medium. Once the error pattern having the special code ID has been designed in operation 602, the method will proceed to an operation 704 where the special code ID is written onto a compact disc media, preferably by the compact disc recording manufacture.

That is, known errors are actually written onto the compact disc media so that when access is again desired for that particular sector of data, only a computer having knowledge of that special code ID will be able to access that particular sector of data (or the compact disc itself). Once the special code ID has been written onto the compact disc media in operation 704, the method will proceed to an operation 706 where the compact disc media is loaded into a CD-ROM drive (or any other optical drive). Next, the method will proceed to an operation 708 where the compact disc media is read and the special code ID that is recorded on the compact disc media is transferred to a computer host.

By way of example, the compact disc drive may either be a built-in compact disc drive (i.e., CD-ROM drive, DVD drive, etc.), or a peripheral device that is in communication with a host computer system. Once this special code ID has been transferred to the computer in operation 708, the method will proceed to an operation 710 where it is determined if there is a request to read a protected sector or sectors. Generally, the request will be initiated by the user of the optical drive that desires access of the protected sector or sectors. Therefore, if it is determined that the particular sector being requested is a protected sector having the designed error pattern, the method will proceed to an operation 712.

In operation 712, the special code ID is transferred from the computer to the CD-ROM drive to enable access to the protected sector, and correction will be performed in operation 714. That is, because the computer host was previously provided with the error pattern associated with the special code ID, the computer making the request for that protected sector will know the exact combination of error correction systems to implement. Of course, if a computer that does not have the special code ID requests access to a protected sector, the request will be denied.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from IEEE of New York, N.Y. may be used to design an appropriate silicon-level layout. For more information on error correction techniques, reference may be made to a commonly assigned U.S. patent application Ser. No. 08/933,568, filed on Sep. 19, 1997, and entitled, "Method and Apparatus for Performing Error Correction Code Operations." This application is hereby incorporated by reference.

The invention may also employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

Figure 8:
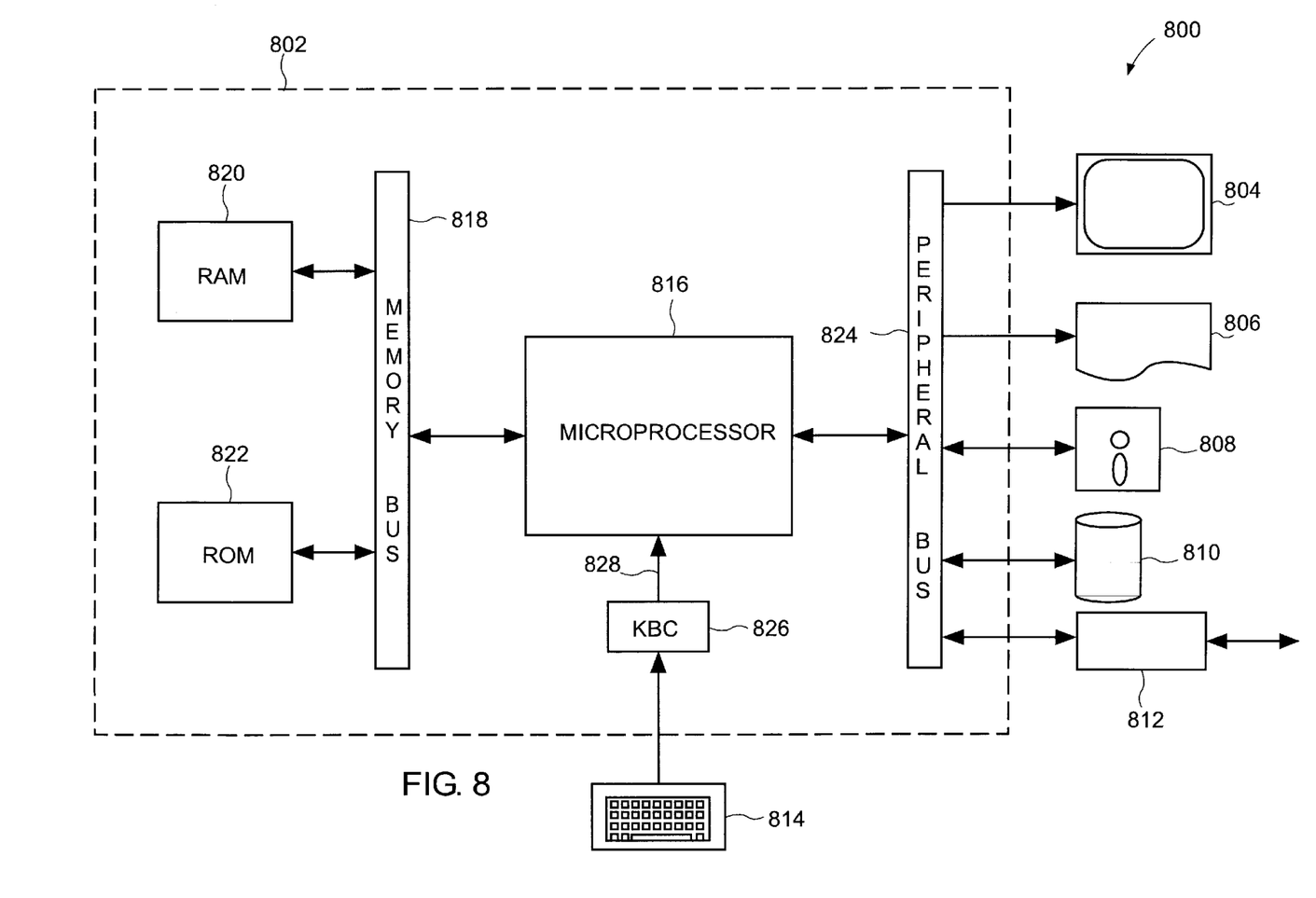
FIG. 8 is a block diagram of an exemplary computer system for carrying out some of the processing according to the invention.

FIG. 8 is a block diagram of an exemplary computer system 800 for carrying out the processing according to the invention. The computer system 800 includes a digital computer 802, a display screen (or monitor) 804, a printer 806, a floppy disk drive 808, a hard disk drive 810, a network interface 812, and a keyboard 814. The digital computer 802 includes a microprocessor 816, a memory bus 818, random access memory (RAM) 820, read only memory (ROM) 822, a peripheral bus 824, and a keyboard controller 826. The digital computer 800 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 816 is a general purpose digital processor which controls the operation of the computer system 800. The microprocessor 816 can be a single-chip processor or can be implemented with multiple components. Using instructions retrieved from memory, the microprocessor 816 controls the reception and manipulation of input data and the output and display of data on output devices. According to the invention, a particular function of microprocessor 816 is to assist in the optical drive device 200 of FIG. 2 in processing error correction.

The memory bus 818 is used by the microprocessor 816 to access the RAM 820 and the ROM 822. The RAM 820 is used by the microprocessor 816 as a general storage area and as scratch-pad memory, and can also be used to store input data and processed data. The ROM 822 can be used to store instructions or program code followed by the microprocessor 816 as well as other data.

The peripheral bus 824 is used to access the input, output, and storage devices used by the digital computer 802. In the described embodiment, these devices include the display screen 804, the printer device 806, the floppy disk drive 808, the hard disk drive 810, and the network interface 812. The keyboard controller 826 is used to receive input from keyboard 814 and send decoded symbols for each pressed key to microprocessor 816 over bus 828.

The display screen 804 is an output device that displays images of data provided by the microprocessor 816 via the peripheral bus 824 or provided by other components in the computer system 800. The printer device 806 when operating as a printer provides an image on a sheet of paper or a similar surface. Other output devices such as a plotter, typesetter, etc. can be used in place of, or in addition to, the printer device 806.

The floppy disk drive 808 and the hard disk drive 810 can be used to store various types of data. The floppy disk drive 808 facilitates transporting such data to other computer systems, and hard disk drive 810 permits fast access to large amounts of stored data.

The microprocessor 816 together with an operating system operate to execute computer code and produce and use data. The computer code and data may reside on the RAM 820, the ROM 822, or the hard disk drive 810. The computer code and data could also reside on a removable program medium and loaded or installed onto the computer system 800 when needed. Removable program mediums include, for example, CD-ROM, PC-CARD, floppy disk and magnetic tape.

The network interface 812 is used to send and receive data over a network connected to other computer systems. An interface card or similar device and appropriate software implemented by the microprocessor 816 can be used to connect the computer system 800 to an existing network and transfer data according to standard protocols.

The keyboard 814 is used by a user to input commands and other instructions to the computer system 800. Other types of user input devices can also be used in conjunction with the present invention. For example, pointing devices such as a computer mouse, a track ball, a stylus, or a tablet can be used to manipulate a pointer on a screen of a general-purpose computer.

The invention can also be embodied as computer readable code on a computer readable medium. The computer readable medium is any data storage device that can store data which can be thereafter be read by a computer system. Examples of the computer readable medium include read-only memory, random-access memory, CD-ROMs, magnetic tape, optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for error code correction using product code, comprising:

(a) reading a data frame and associated check bytes from a media;

(b) generating an error correction model for the data frame and associated check bytes, the error correction model being defined by non-zero syndromes in the check bytes of Q dimension code words and P dimension code words of the data frame;

(c) examining the generated error correction model;

(d) correcting the data frame using a combination of error correction systems that are selected based on the examining of the generated error correction model;

(e) reading a next data frame and associated check bytes from a media and repeating operations (b) through (d);

(f) repeating operations (a) through (e) for a predetermined number of data frames and associated check bytes; and (g) determining whether a pre-set level of correction is achieved for the predetermined number of data frames and associated check bytes;

wherein when the pre-set level of correction is not achieved, the data frame is corrected using a new combination of error correction systems that are selected based on the examining of the generated error correction model, and operations (a) through (g) are repeated.

2. A method for error code correction using product code as recited in claim 1, wherein the error correction systems are selected from a group consisting of a P dimension single error correction, a Q dimension single error correction system, a P dimension erasure correction system, and a Q dimension erasure correction system.

3. A method for error code correction using product code as recited in claim 1, further comprising: determining whether the data frame and associated check bytes have been corrected, the determining to occur following operation (d); selecting a new combination of error correction systems that have not been previously used if the determining indicates that the data frame and associated check bytes have not been corrected; and repeating operations (a) through (d) using the new combination of error correction systems.

4. A method for error code correction using product code as recited in claim 1, wherein the method is executed at least in part in a semiconductor chip.

5. A method for error code correction using product code as recited in claim 1, wherein the method is used in the encryption of data of an optical disc.

* * * * *